(12) United States Patent
Ishino

(10) Patent No.: US 6,583,843 B2
(45) Date of Patent: *Jun. 24, 2003

(54) LCD MODULE

(75) Inventor: Masahide Ishino, Shizuoka (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,317

(22) Filed: Feb. 10, 1999

(65) Prior Publication Data

US 2002/0071084 A1 Jun. 13, 2002

(30) Foreign Application Priority Data

Feb. 12, 1998 (JP) .......................................... 10-046266

(51) Int. Cl.⁷ ....................... G02F 1/1345; G02F 1/1333
(52) U.S. Cl. .......................... 349/149; 349/150; 349/58
(58) Field of Search .................................. 349/149, 150, 349/58

(56) References Cited

U.S. PATENT DOCUMENTS 5,680,191 A * 10/1997 Voisin et al. ................ 349/150
5,889,572 A * 3/1999 Takahashi et al. ........... 349/149

FOREIGN PATENT DOCUMENTS

JP    2-29621    1/1990
JP    2-52313    2/1990

* cited by examiner

*Primary Examiner*—Robert H. Kim
*Assistant Examiner*—Dung Nguyen
(74) *Attorney, Agent, or Firm*—Young & Thompson

(57) ABSTRACT

An LCD (Liquid Crystal Display) module of the present invention forms, when received in a frame by way of example, gaps corresponding to the dimension of extensions between the inner walls of the frame and the edges of glass sheets constituting an LCD panel. The gaps prevent the walls of the inside of the frame from contacting the edges of the glass sheets and thereby protect the glass sheets from damage even when a shock or an impact acts on the frame. Further, because the corners of the glass sheets do not contact the corners of the inside of the frame, it is not necessary to provide the corners of the inside of the frame with a conventional special configuration. The frame is therefore easy to design and fabricate.

5 Claims, 17 Drawing Sheets

LCD MODULE

BACKGROUND OF THE INVENTION

The present invention relates to an LCD (Liquid Crystal Display) module and more particularly to a structure for affixing an LCD module.

An LCD module is generally made up of an LCD panel and a printed circuit board. The LCD panel has a generally rectangular configuration, as seen in a plan view. The printed circuit board is held in close contact with the rear of the panel and carries circuitry for driving the panel thereon. The panel is constituted by two glass sheets adhered together. Flexible printed circuit boards are mounted on the edges of the module, and each is bent inward over the edges of the panel and circuit board. Each flexible printed circuit board is connected at one end to the circuit board and at the other end to the panel. The module with this configuration is accommodated in a frame formed of synthetic resin or metal. The frame with the module is mounted to, e.g., the casing of an LCD device. To affix the module to the frame, use may be made of two-sided adhesive tapes or a press fitting technique.

The above conventional LCD module has some problems left unsolved, as follows. The glass sheets constituting the LCD panel have edges abutting or substantially abutting against the walls of the inside of the frame. This brings about a problem that a shock or an impact that may act on the frame from the outside causes the edges of the glass sheets to hit against the walls of the frame. As a result, the glass sheets are apt to chip or crack, practically disabling the module from displaying an image. Particularly, only one of the glass sheets is present at the edges of the panel where the flexible printed circuit boards are mounted. This aggravates the above chipping or cracking problem. Further, when the edges of the glass sheets have fine chipped portions or burrs, cracking or chipping grows from the chipped portions or burrs when subjected to an impact, resulting in critical damage.

Moreover, at a position where each glass sheet is positioned alone and forms a corner together with the other glass sheet, the glass sheets are far more susceptible to an impact than at the other positions. The frame must therefore have its portion corresponding to the above position hollowed out, so that the corners of the glass sheets will not contact the frame.

Technologies relating to the present invention are disclosed in, e.g., Japanese Patent Laid-Open Publication Nos. 4-220623 and 7-42245.

SUMMARY OF THE INVENTION

It is therefore an object of the present invention to provide an LCD module capable of protecting glass sheets constituting an LCD panel from damage ascribable to direct contact thereof with, e.g., a frame and making it needless to provide the frame with a special configuration.

An LCD module of the present invention includes an LCD panel having a substantially rectangular configuration, as seen in a plan view, and a printed circuit board held in close contact with the rear of the LCD panel and carrying circuitry for driving the LCD panel thereon. The printed circuit board includes extensions extending outward of the LCD panel at at least two corners of the LCD panel.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

To better understand the present invention, brief reference will be made to a conventional LCD module, shown in FIGS. 1–7. As shown, the LCD module, generally 102 is generally made up of an LCD panel 104 and a printed circuit board 106. The LCD panel 104 has a generally rectangular configuration, as seen in a plan view. The printed circuit board 106 is held in close contact with the rear of the panel 104 and carries circuitry for driving the panel 104 thereon.

Figure 1:
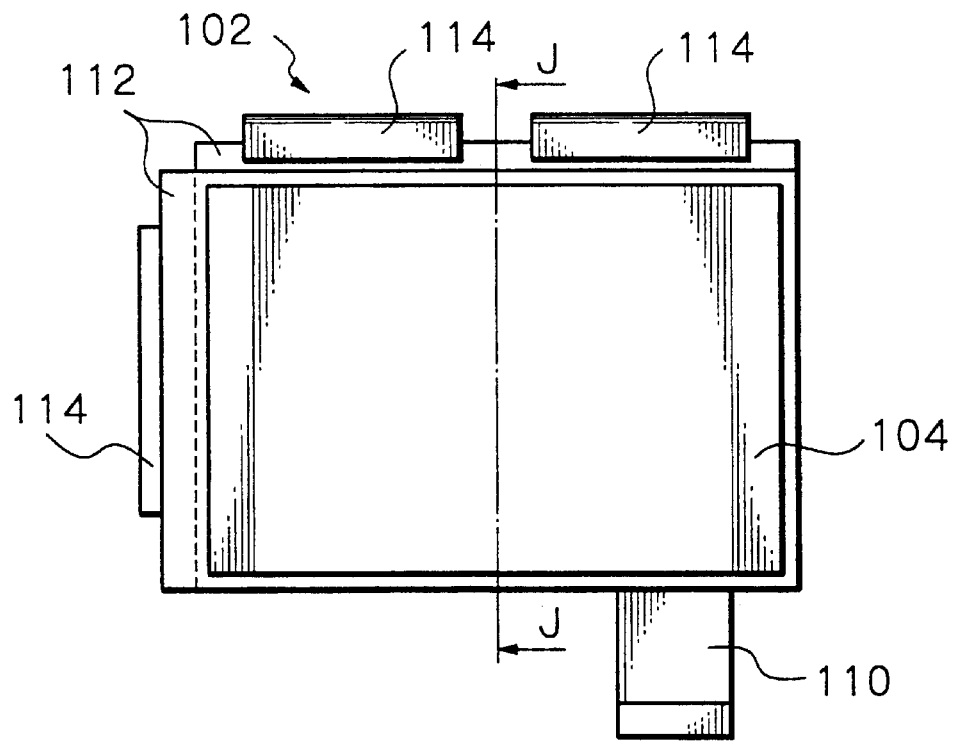
FIG. 1 is a front view showing a conventional LCD module.
Figure 2:
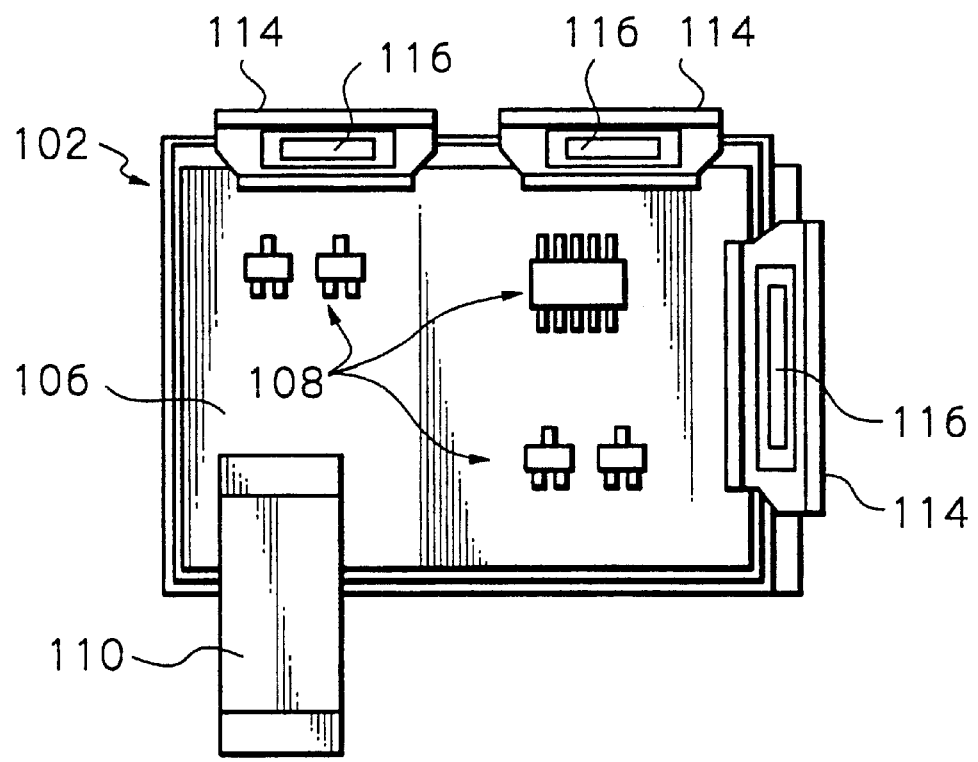
FIG. 2 is a rear view of the module shown in FIG. 1.
Figure 3:
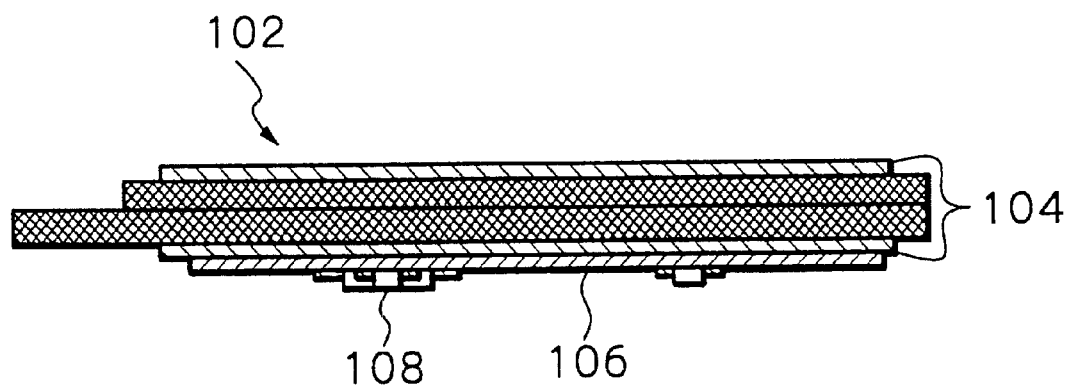
FIG. 3 is a section along line J—J of FIG. 1.

As shown in FIG. 2, various electronic parts 108 are mounted on the printed circuit board 106. A cable 110 is connected to the printed circuit board 106 for feeding video signals, timing control signals and so forth to the circuit board 106 from the outside. The printed circuit board 106, like the panel 104, has a generally rectangular configuration, as seen in a plan view, but is slightly smaller in contour than the panel 104. The printed circuit board 106 is positioned at the inside of the panel 104 and affixed to the panel 104 by two-sided adhesive tapes or similar adhering members. The panel 104 is constituted by two glass sheets 112 adhered together.

Flexible printed circuit boards 114 are mounted on the edges of the module 102, and each is bent inward over the edges of the panel 104 and printed circuit board 106. Each flexible printed circuit board 114 is connected at one end to the printed circuit board 106 and at the other end to the panel 104. An IC (Integrated Circuit) 116 is mounted on each flexible printed circuit board 114 for driving the panel 104. Such ICs 116 are electrically connected to the printed circuit board 106 and panel 104 by wiring patterns, not shown, formed on the flexible circuit boards 114. A mounting technology using flexible printed circuit boards is generally referred to as TAB (Tape Automated Bonding).

As shown in FIGS. 4–7, the module 102 having the above configuration is accommodated in a frame 119 formed of synthetic resin or metal. The frame 119 with the module 102 is mounted to, e. g., the casing of an LCD device, not shown. To affix the module 102 to the frame 102, use may be made of two-sided adhesive tapes or a press fitting technique.

Figure 4:
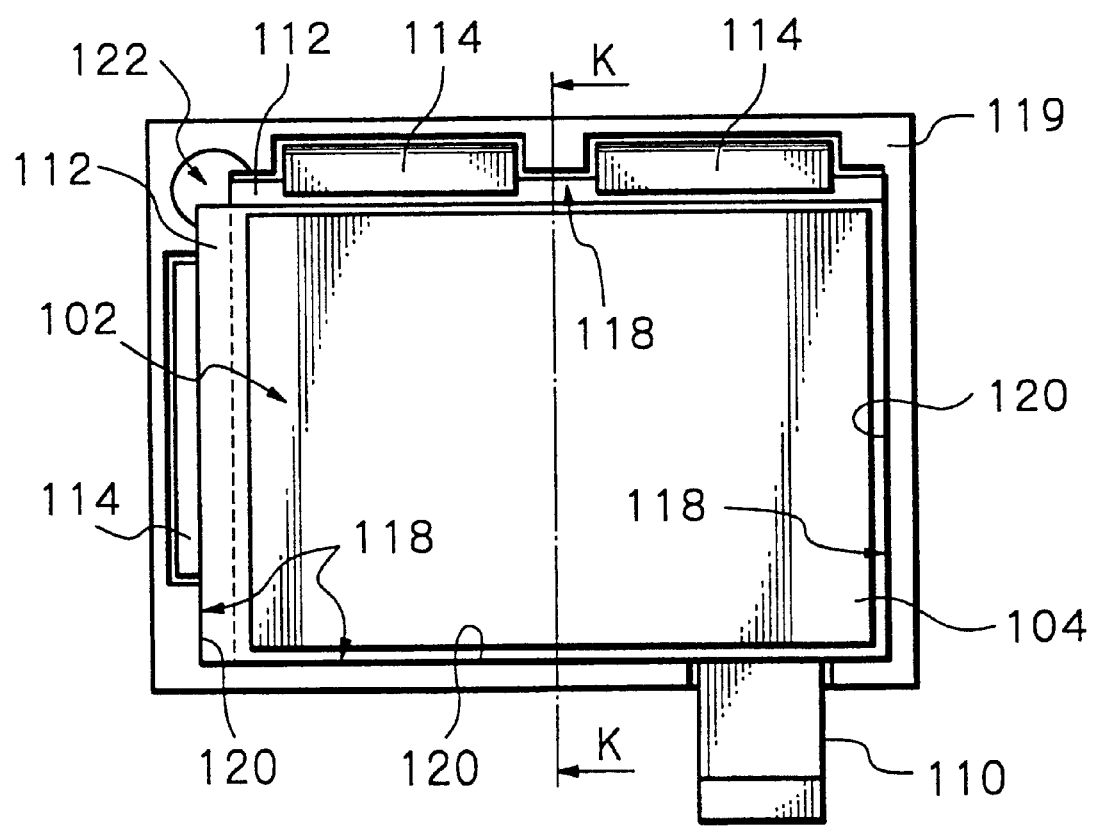
FIG. 4 is a front view showing the conventional module received in a frame.
Figure 5:
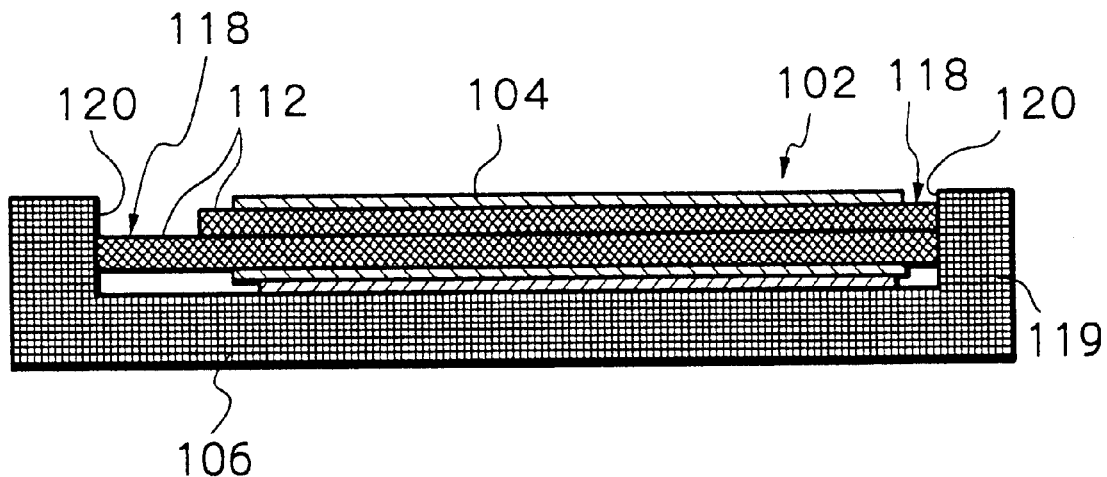
FIG. 5 is a section along line K—K of FIG. 4.
Figure 6:
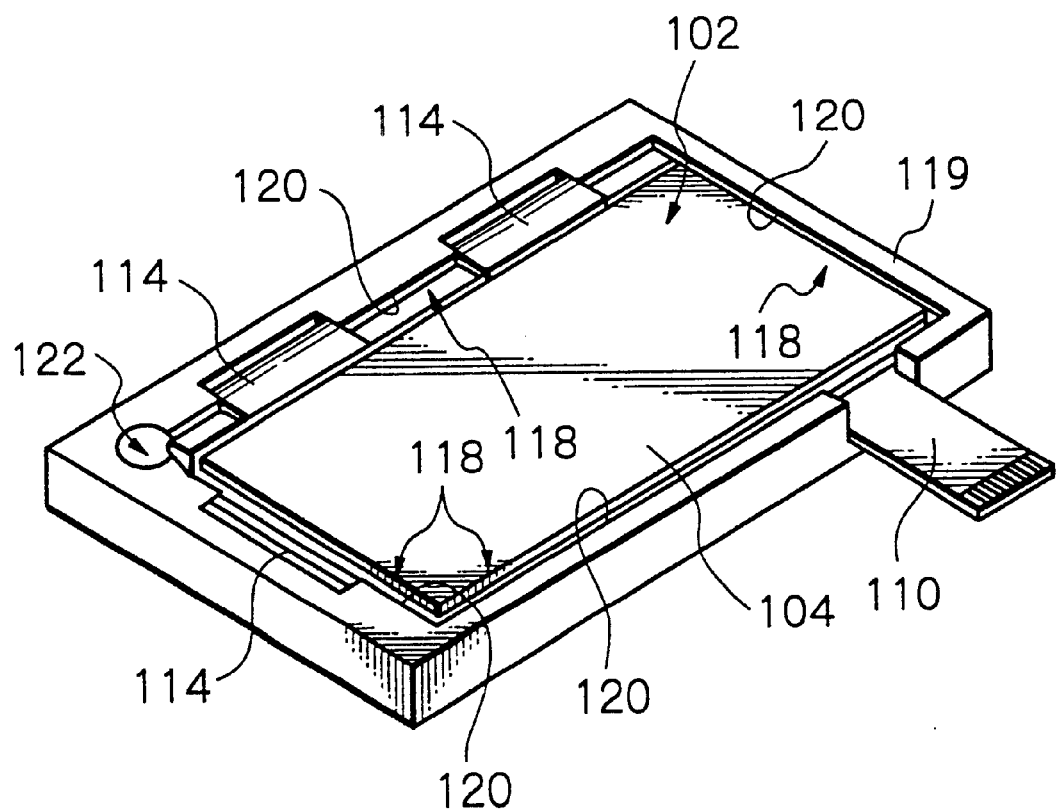
FIG. 6 is a perspective view of the conventional module received in the frame.
Figure 7:
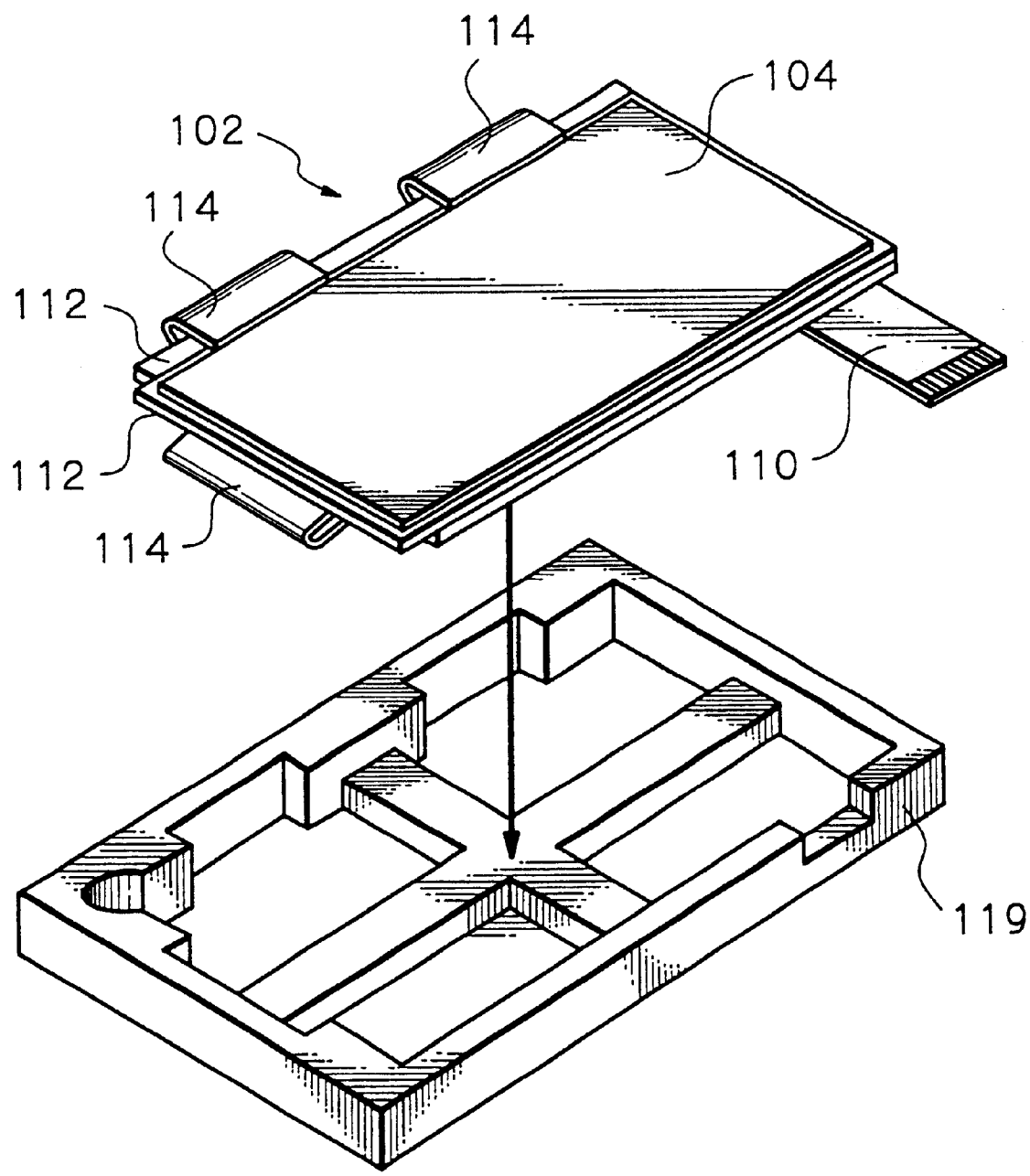
FIG. 7 is an exploded perspective view demonstrating how the conventional module is mounted to the frame.
Figure 8:
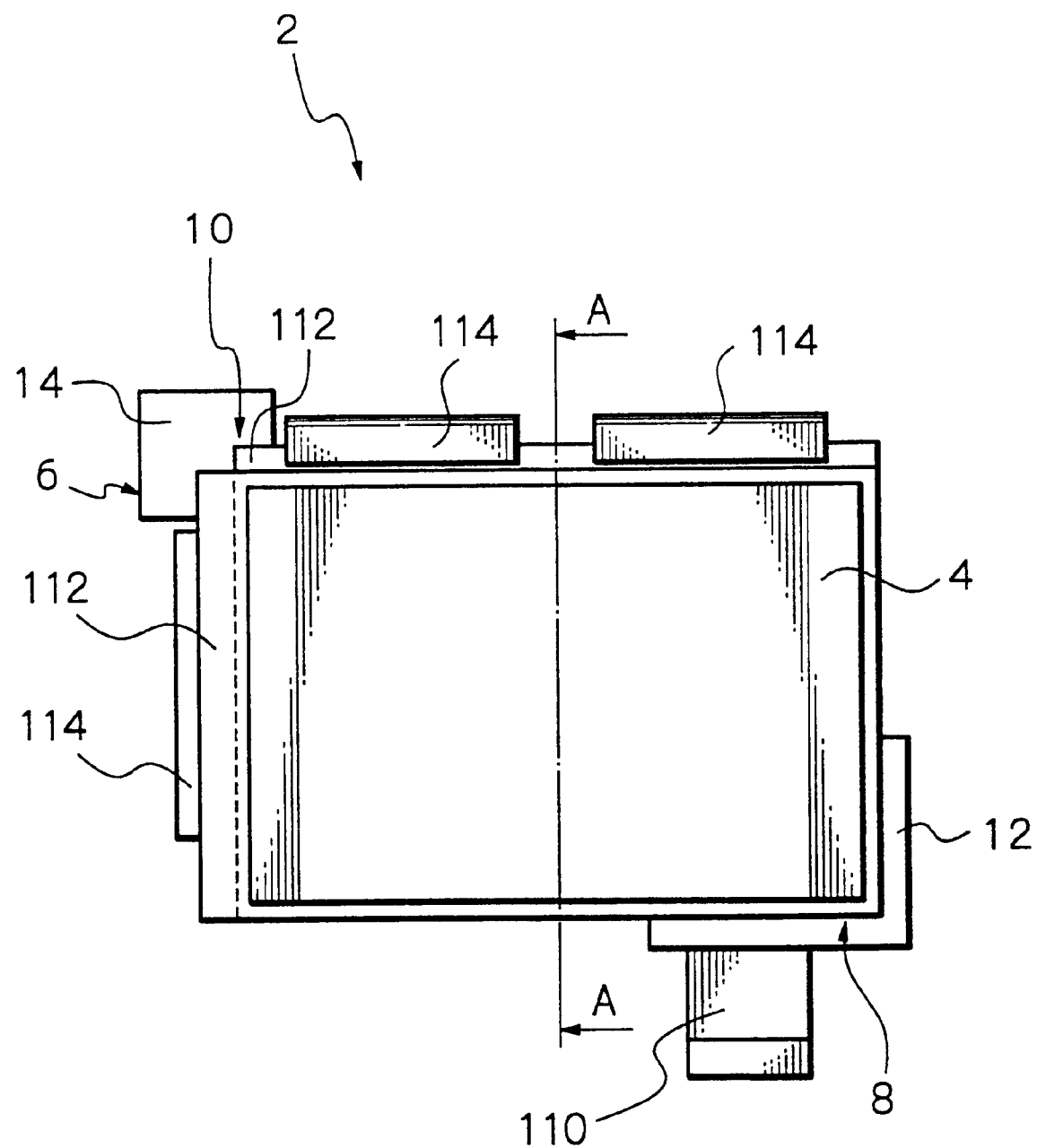
FIG. 8 is a plan view showing a first embodiment of the LCD module in accordance with the present invention.
Figure 9:
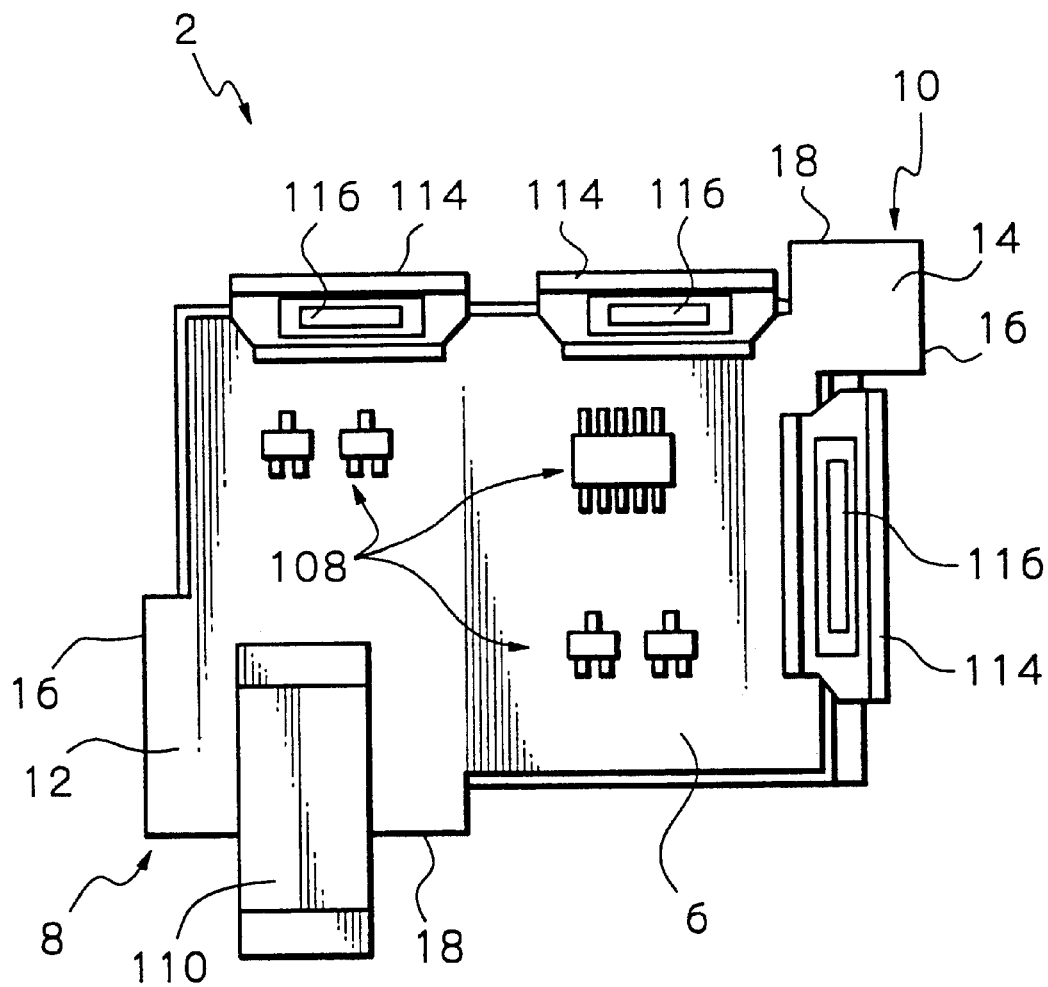
FIG. 9 is a rear view of the module of the first embodiment.
Figure 10:
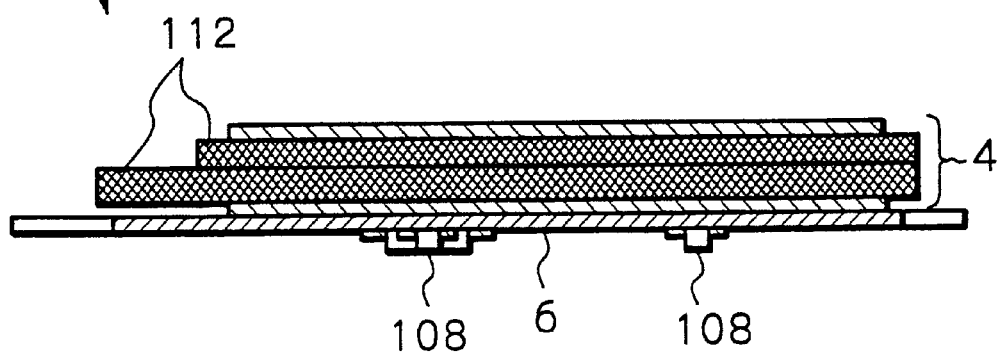
FIG. 10 is a section along line A—A of FIG. 8.

As FIGS. 4–6 indicate, the glass sheets 112 constituting the panel 104 have edges 118 abutting or substantially abutting against the walls 120 of the inside of the frame 119. This brings about a problem that a shock or an impact that may act on the frame 119 from the outside causes the edges 118 of the glass sheets 112 to hit against the walls 120 of the frame 119. As a result, the glass sheets 112 are apt to chip or crack, practically disabling the module 102 from displaying an image. Particularly, only one of the glass sheets 112 is present at the edges of the panel 104 where the flexible printed circuit boards 114 are mounted. This aggravates the above chipping or cracking problem. Further, when the edges 118 of the glass sheets 112 have fine chipped portions or burrs, cracking or chipping grows from the chipped portions or burrs when subjected to an impact, resulting in critical damage.

Moreover, as shown in FIG. 4, at a position where each glass sheet 112 is positioned alone and forms a corner together with the other glass sheet 112, the glass sheets 112 are far more susceptible to an impact than at the other positions. The frame 119 must therefore have its portion 122 corresponding to the above position hollowed out, so that the corners of the glass sheets 112 will not contact the frame 119.

Referring to FIGS. 8–12, a first embodiment of the LCD module in accordance with the present invent ion will be described. In FIGS. 8–12, structural elements identical with the structural elements shown in FIGS. 1–7 are designated by like reference numerals.

As shown, the LCD module, generally 2, is generally made up of an LCD panel 4 and a printed circuit board 6. The LCD panel 4 has a generally rectangular configuration, as seen in a plan view. The printed circuit board 6 is held in close contact with the rear of the panel 4 and carries circuitry for driving the panel 4 thereon. The printed circuit board 6 includes extensions 12 and 14 extending to the outside of the panel 4 at two diagonally opposite corners 8 and 10 of the panel 4.

The printed circuit board 6 has a generally rectangular configuration, as seen in a plan view. The contour of the printed circuit board 6 except for the extensions 12 and 14 is slightly smaller than the contour of the panel 4, so that the circuit board 6 does not protrude from the panel 4. The printed circuit board 6 is affixed to the rear of the panel 4 by two-sided adhesive tapes or similar adhering members. Various electronic parts 108 are mounted on the printed circuit board 6, as in the conventional module. A cable 110 is connected to the printed circuit board 6 for feeding video signals, timing control signals and so forth to the circuit board 6 from the outside.

Flexible printed circuit boards 114 are mounted on the edges of the module 102, and each is bent inward over the edges of the panel 4 and printed circuit board 6. Each flexible printed circuit board 114 is connected at one end to the printed circuit board 6 and at the other end to the panel 4. ICs 116 are mounted on the flexible printed circuit boards 114 for the previously stated purpose.

To form each of the extensions 12 and 14, two continuous edges of the circuit board 6 perpendicular to each other are extended outward at the corner 8 or 10 of the circuit board 6. Therefore, each extension 12 or 14 has outer edges 16 and 18 substantially parallel to the edges of the major portion of the circuit board 6. In addition, the angle between the edges 16 and 18 contiguous with each other is substantially 90 degrees.

Figure 11:
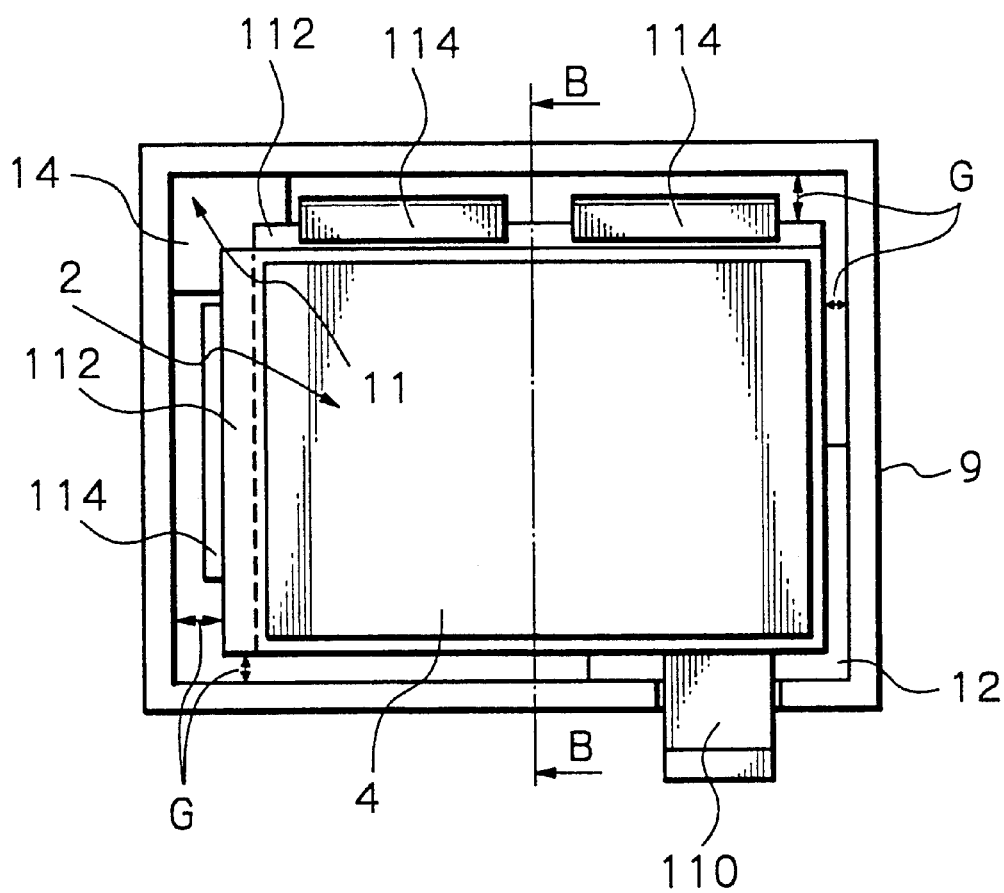
FIG. 11 is a front view showing the module of FIG. 8 received in a frame.
Figure 12:
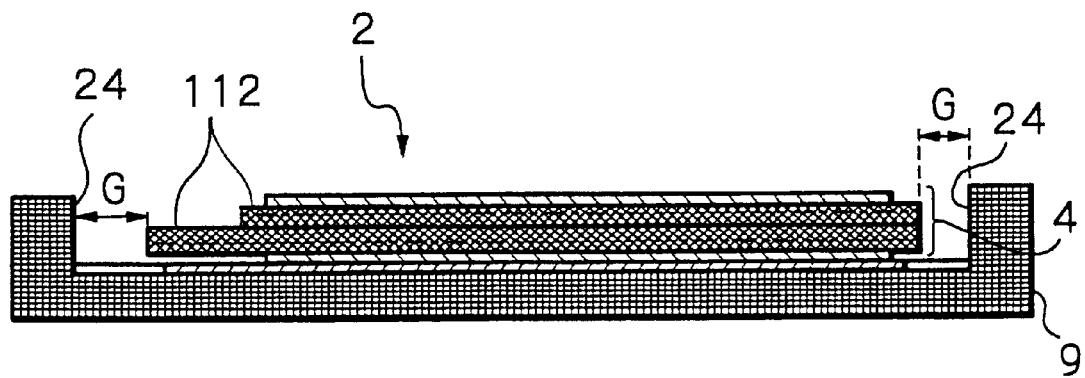
FIG. 12 is a section along line B—B of FIG. 11.

As shown in FIGS. 11 and 12, the module 2 having the above configuration is accommodated in a frame 9 also having a generally rectangular configuration, as seen in a plan view. The frame 9 with the module 2 is mounted to, e.g., the casing of an LCD device not shown. In this condition, gaps G corresponding to the dimension of the extensions 12 and 14 are formed between the walls 24 of the inside of the frame 9 and the edges of the glass sheets 112. It follows that the walls 24 of the frame 9 do not contact the edges of the glass sheets 112 even when subjected to a shock or an impact. This protects the glass sheets 112 and therefore the module 2 from damage.

Further, because the corners of the glass sheets 112 do not contact the corners 11 of the frame 9, it is not necessary to provide the corners of the frame 9 with the conventional special configuration. The frame 9 is therefore easy to design and fabricate.

Figure 13:
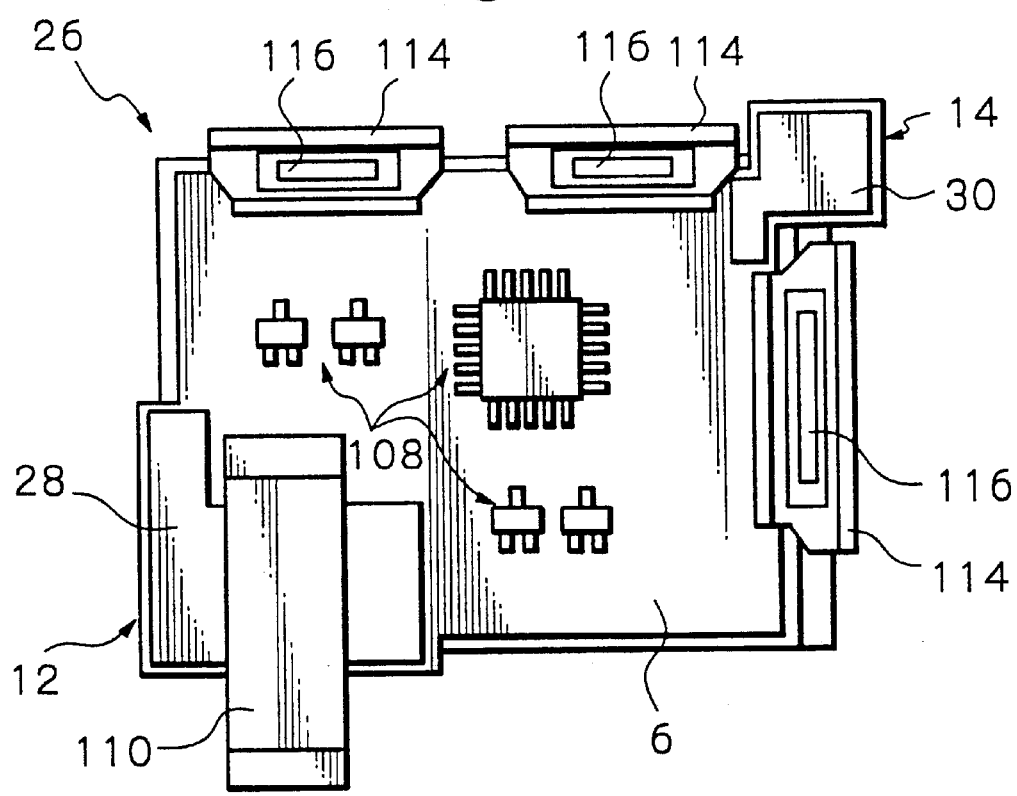
FIG. 13 is a rear view showing a second embodiment of the present invention.

Reference will be made to FIG. 13 for describing a second embodiment of the present invention. In FIG. 13, structural elements identical with the structural elements shown in FIGS. 8–12 are designated by like reference numerals. As shown, an LCD module 26 is essentially similar to the LCD module 2 except that electrodes 28 and 30 implemented by metal layers are formed on substantially the entire extensions 12 and 14, respectively. The electrodes 28 and 30 successfully increase the mechanical strength of the extensions 12 and 14 and render the extensions 12 and 14 more resistive to shocks and impacts.

Figure 15:
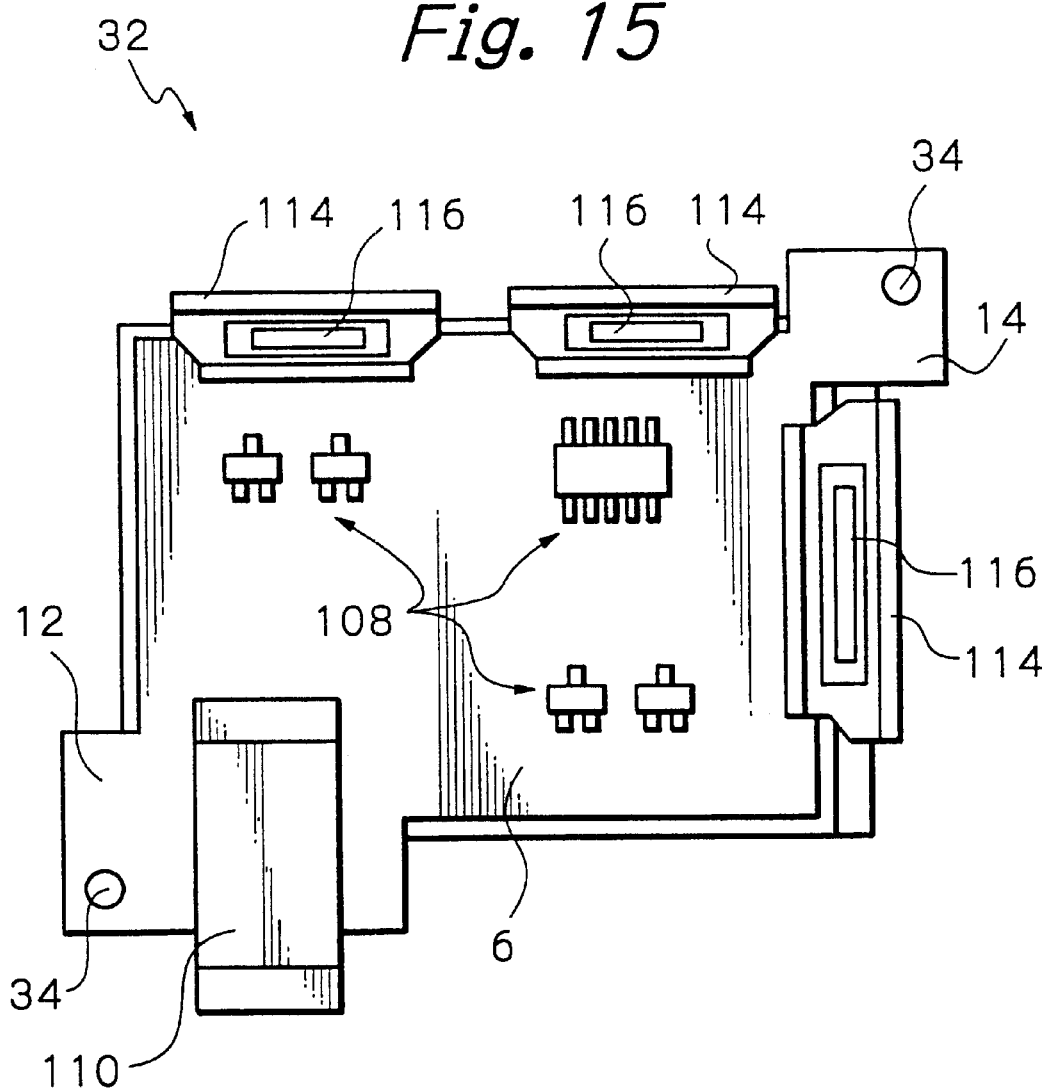
FIG. 15 is a rear view of the third embodiment.
Figure 16:
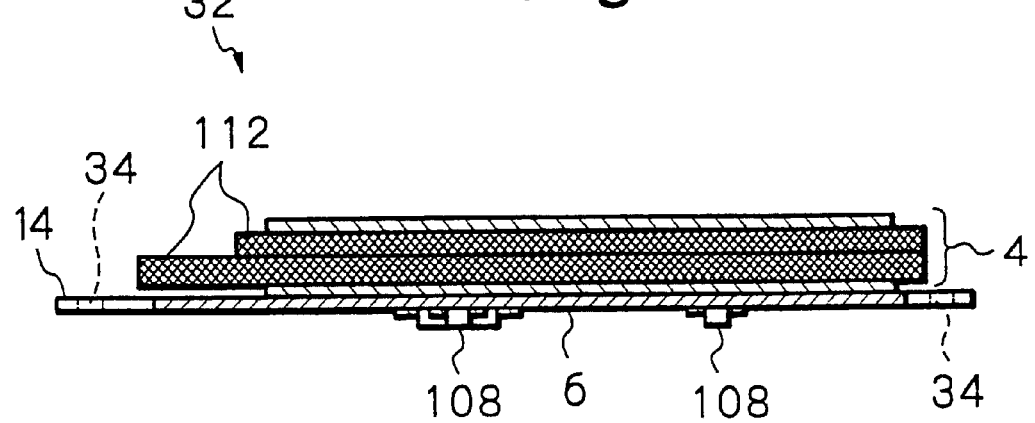
FIG. 16 is a section along line C—C of FIG. 14.
Figure 17:
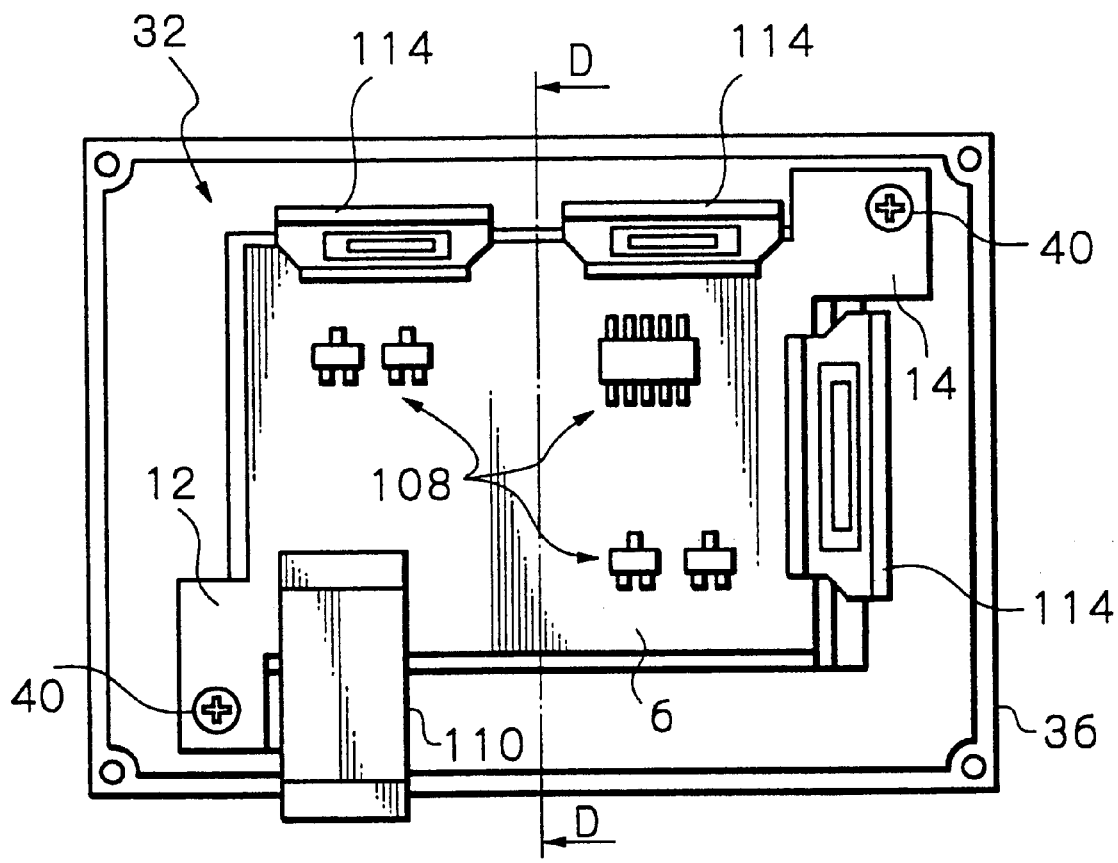
FIG. 17 is a front view showing how the module of FIG. 14 is mounted to a casing.

FIGS. 14–18 show a third embodiment of the present invention. FIG. 17 shows an LCD module 32 received in a casing 36. In FIGS. 14–18, structural elements identical with the structural elements shown in FIGS. 8–12 are designated by like reference numerals and will not be described specifically in order to avoid redundancy.

Figure 14:
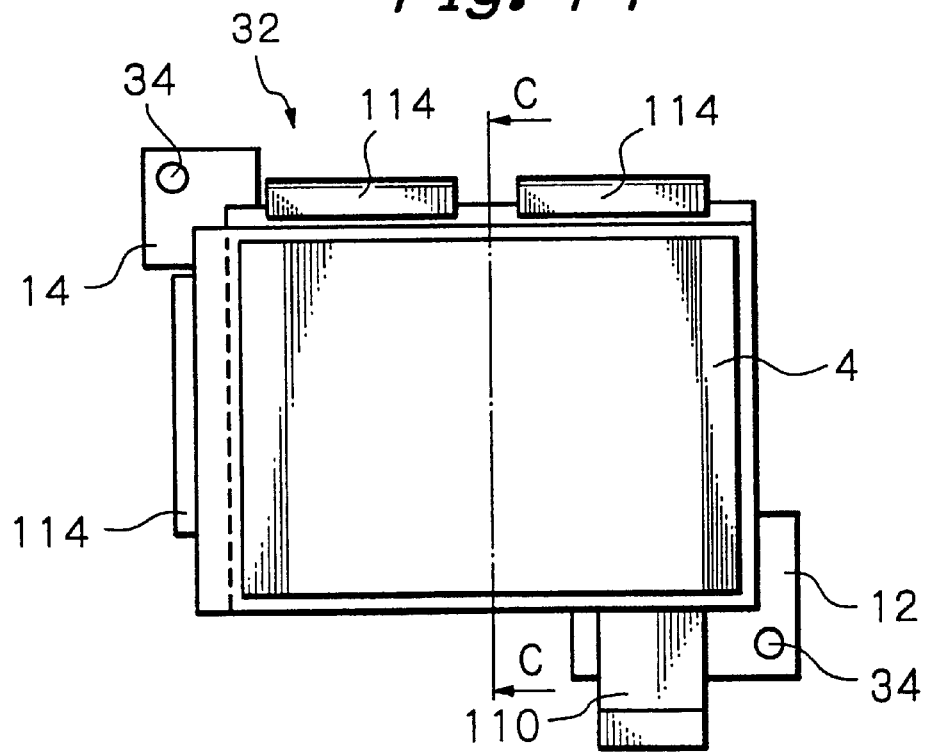
FIG. 14 is a front view showing a third embodiment of the present invention.
Figure 18:
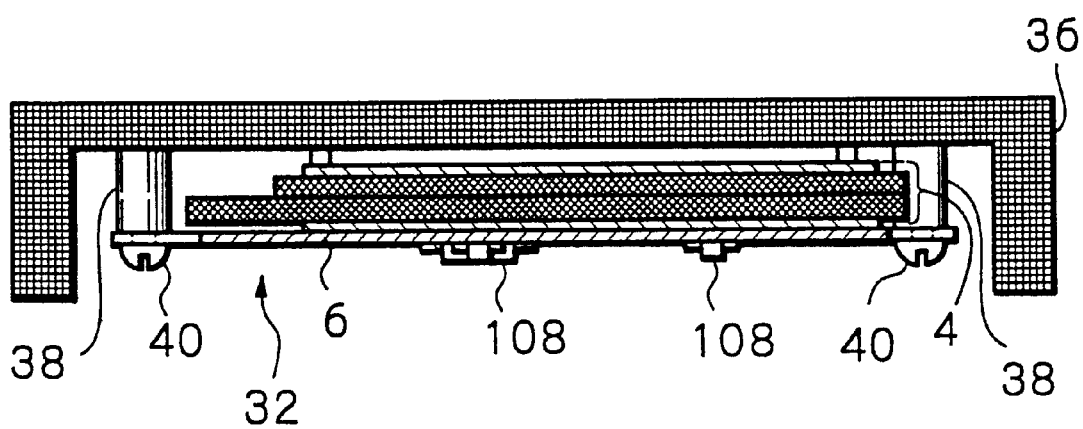
FIG. 18 is a section along line D—D of FIG. 17.
Figure 19:
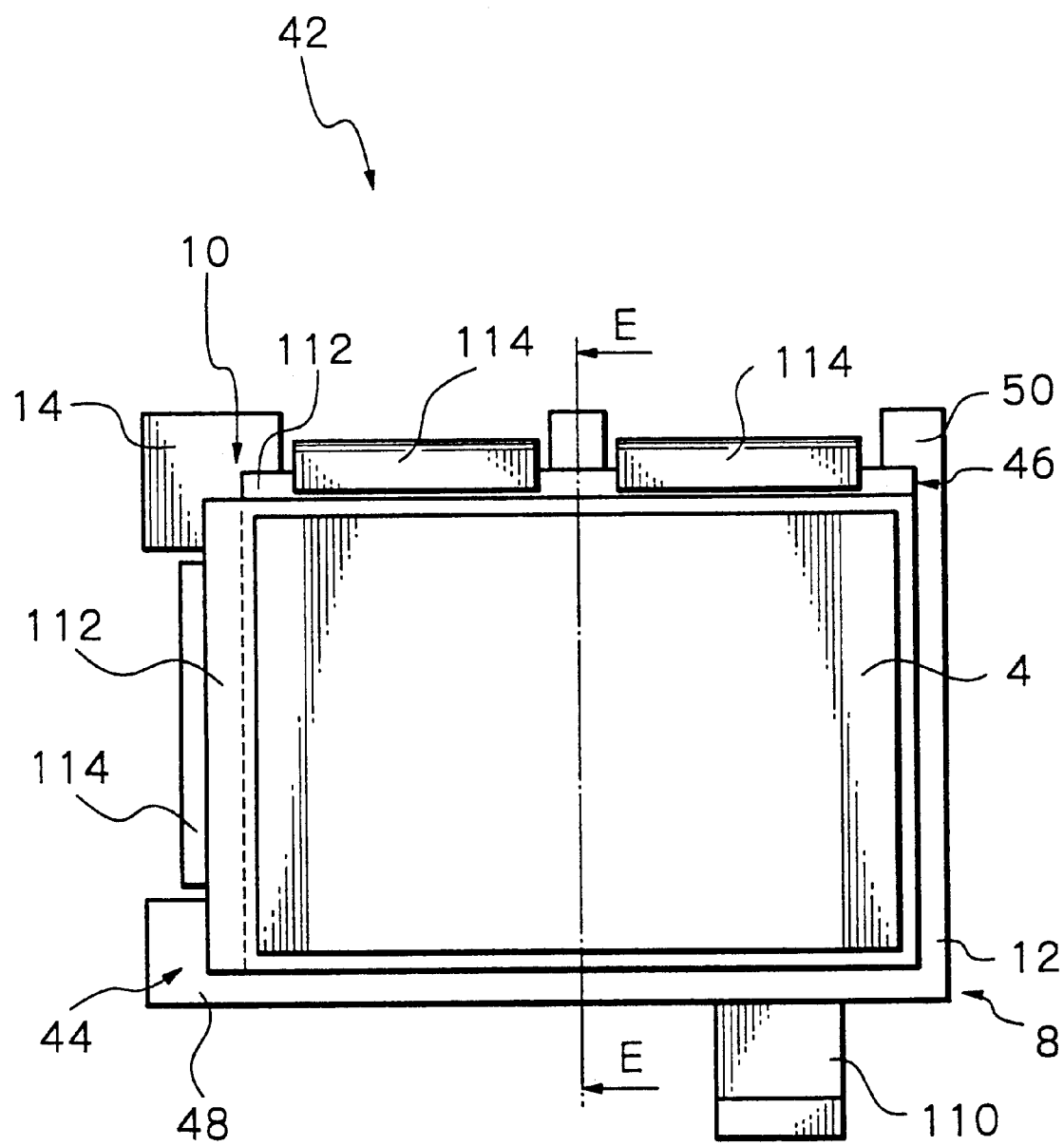
FIG. 19 is a front view showing a fourth embodiment of the present invention.
Figure 20:
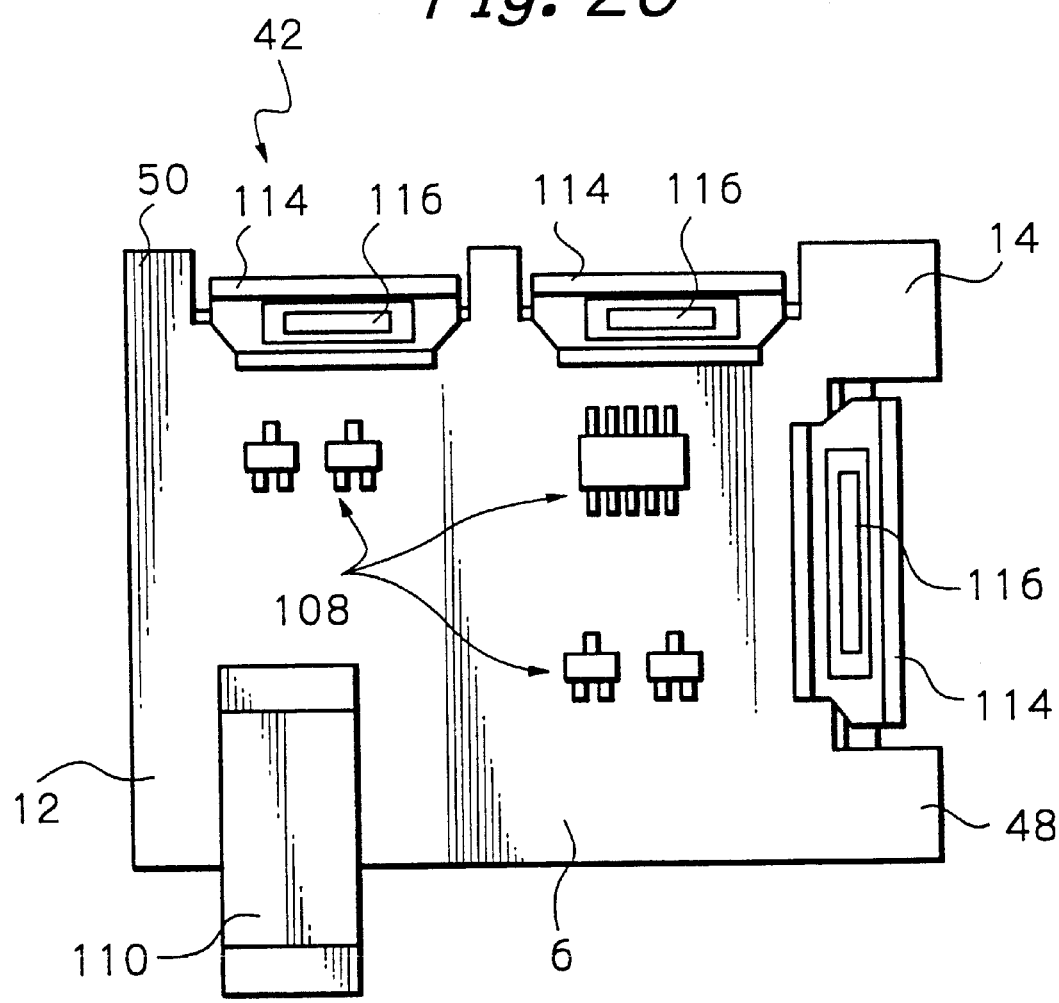
FIG. 20 is a rear view of the fourth embodiment.
Figure 21:
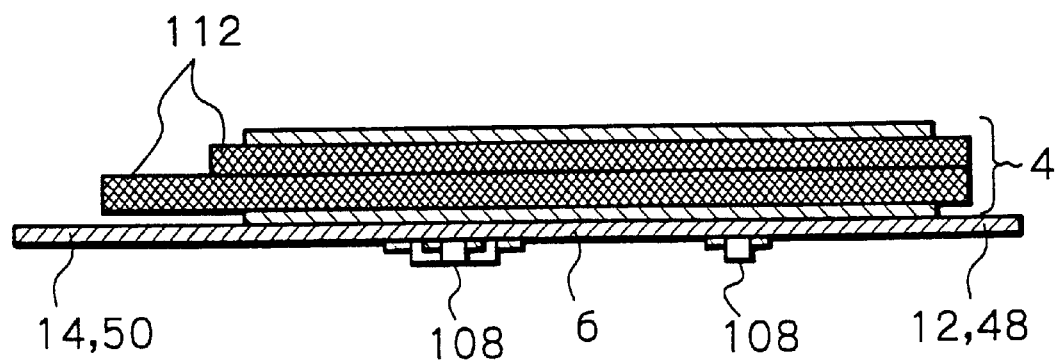
FIG. 21 is a section along line E—E of FIG. 19.

As shown in FIGS. 14–16, the module 32 is essentially similar to the module 2 except that each of the extensions 12 and 14 of the printed circuit board 6 is formed with a hole 34. The module 32 can therefore be directly mounted to, e.g., the casing of an LCD device without the intermediary of a frame. Specifically, as shown in FIGS. 17 and 18, spacers 38 are positioned between the extensions 12 and 14 and a casing 36. The module 32 is fastened to the casing 36 by screws 40 with the intermediary of the spacers 38. Because a frame is absent between the module 32 and the casing 36, the edges of the glass sheets 112 is free from damage ascribable to the walls of a frame. Moreover, even when the casing 36 for receiving the module 32 is relatively small size, gaps at least corresponding to the dimension of the extensions 12 and 14 isolate the glass sheets 112 from the walls of the inside of the casing 36 and protect the glass sheets 112 from damage.

Figure 22:
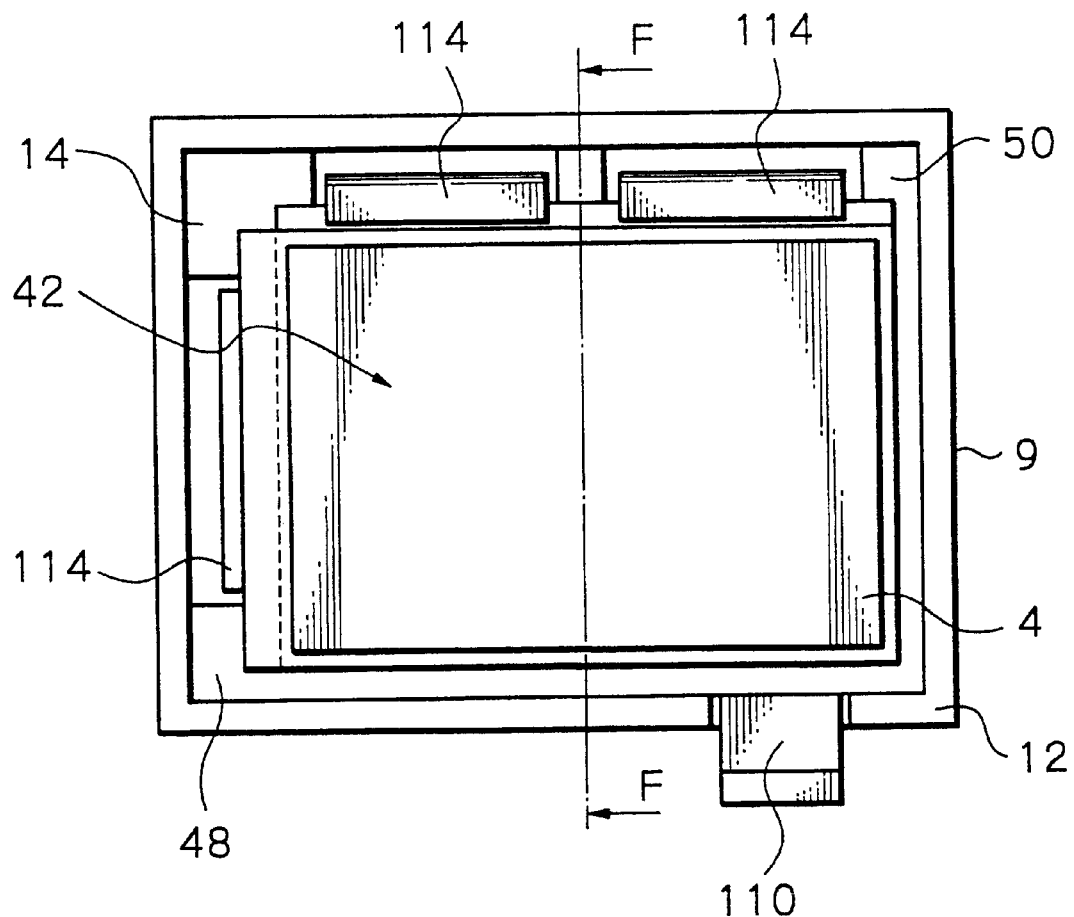
FIG. 22 is a front view showing the module of the fourth embodiment received in a frame.
Figure 23:
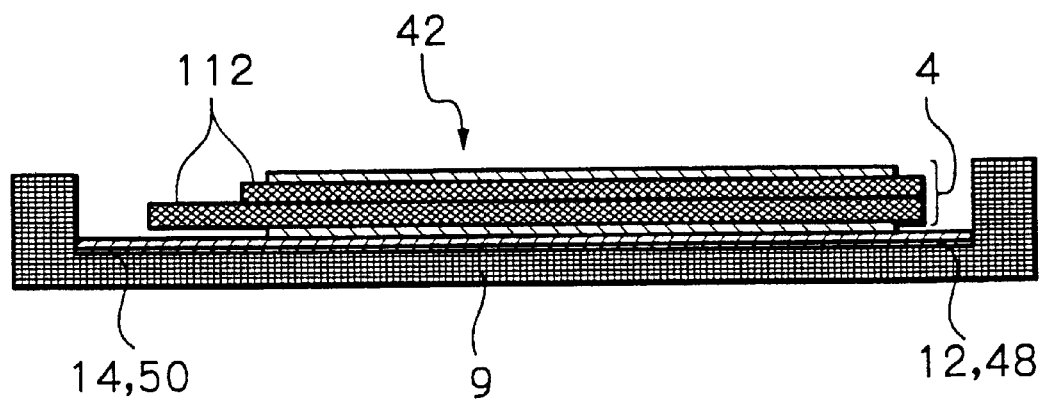
FIG. 23 is a section along line F—F of FIG. 22.

A fourth embodiment of the present invention is shown in FIGS. 19–23. FIG. 22 shows an LCD module 42 received in a frame. In FIGS. 19–23, structural elements identical with the structural elements shown in FIGS. 8–12 are designated by like reference numerals and will not be described specifically in order to avoid redundancy. As shown, the module 42 differs from the module 42 in that the printed circuit board 6 includes extensions 48 and 50 in addition to the extensions 12 and 14. The extensions 48 and 50 are respectively positioned at corners 44 and 46 of the panel 4 different from the corners 8 and 10. This protects the glass sheets 112 of the panel 4 from damage more positively. The four extensions may, of course, be replaced with three extensions each being positioned at particular one of the four corners.

Figure 24:
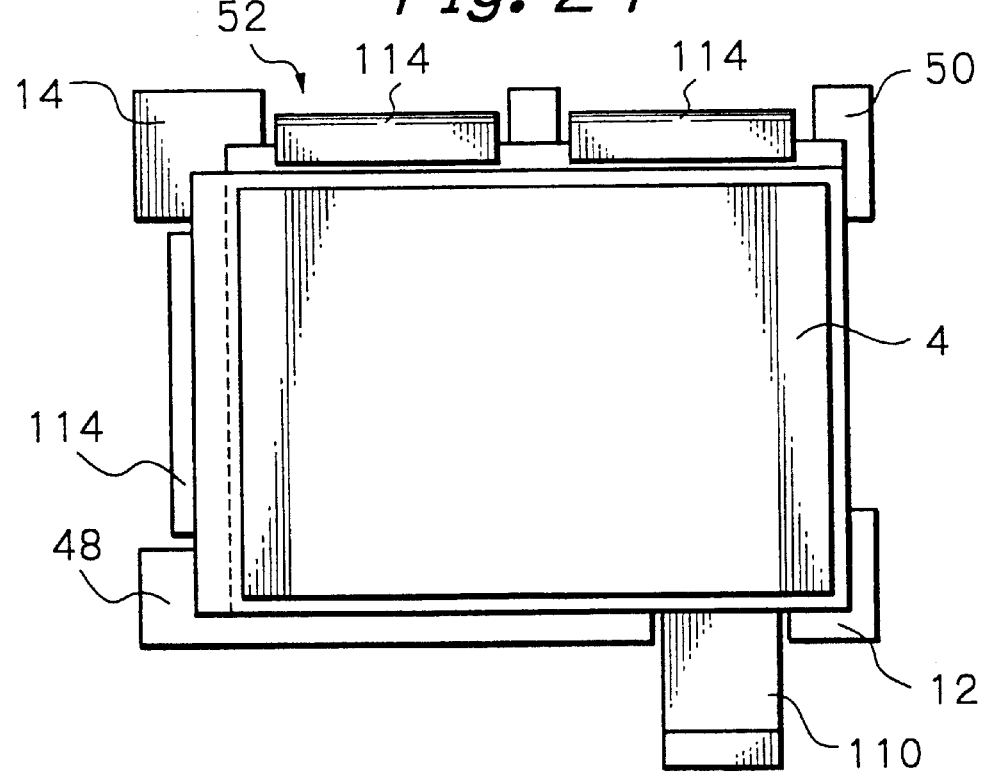
FIG. 24 is a front view showing a fifth embodiment of the present invention.
Figure 25:
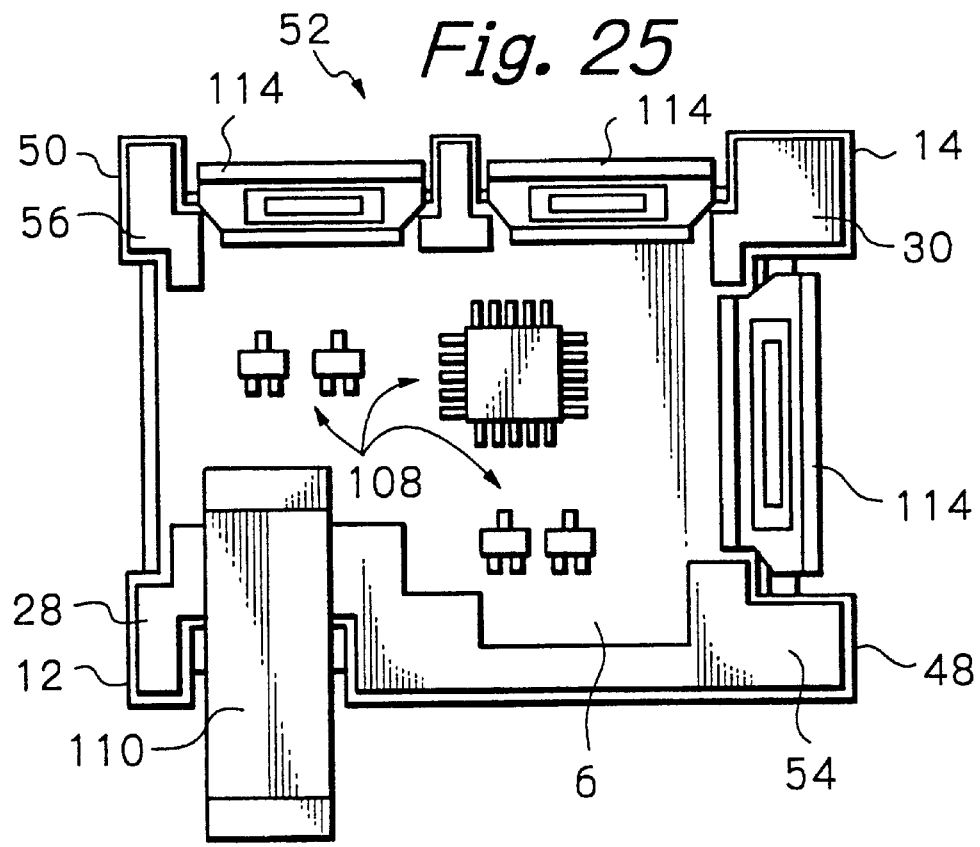
FIG. 25 is a rear view of the fifth embodiment.
Figure 26:
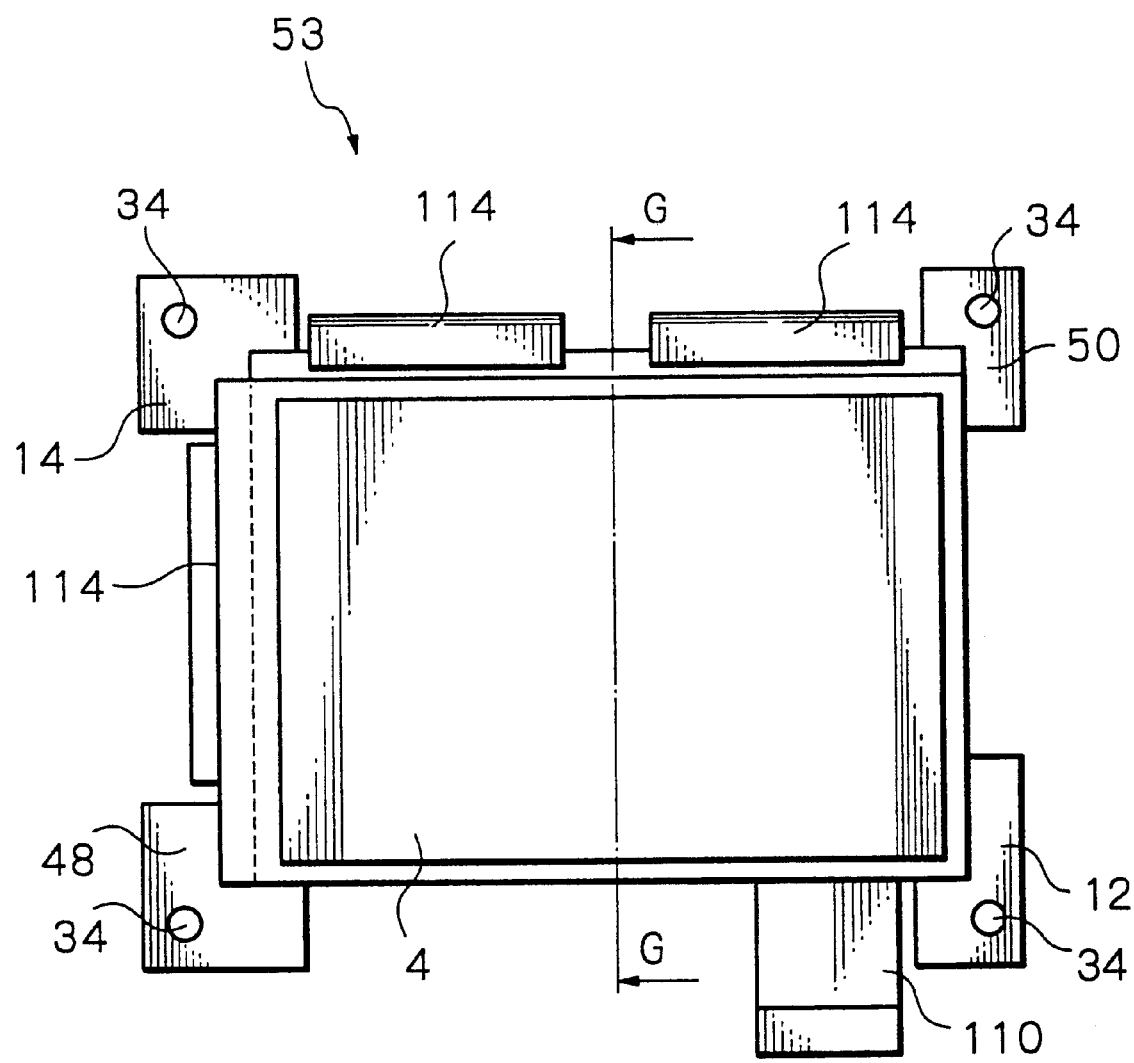
FIG. 26 is a front view showing a sixth embodiment of the present invention.
Figure 27:
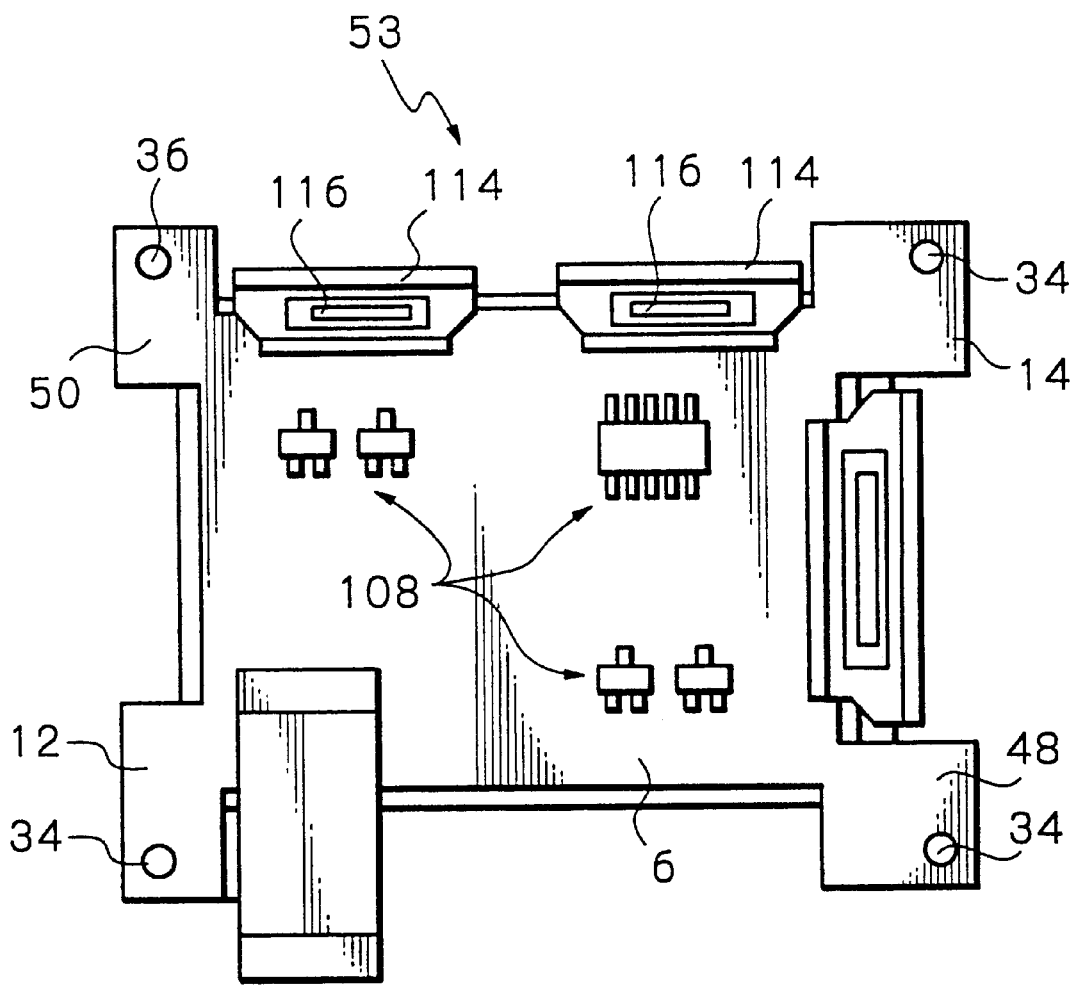
FIG. 27 is a rear view of the sixth embodiment.
Figure 28:
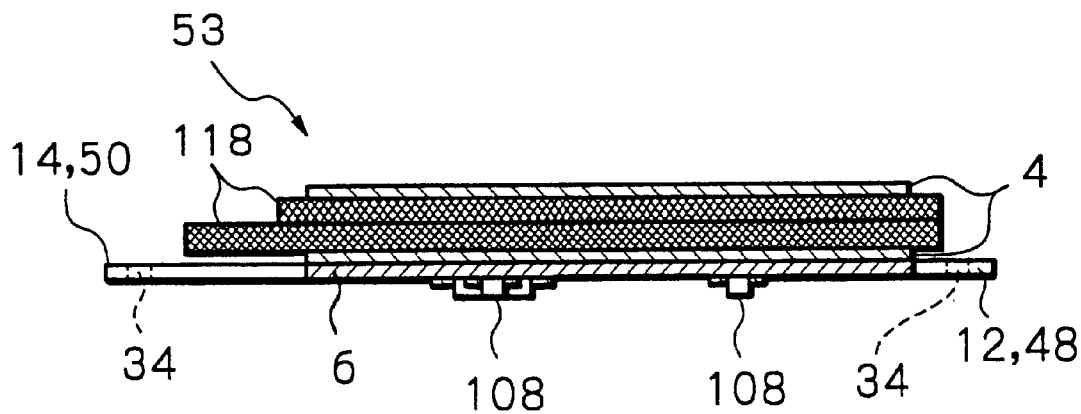
FIG. 28 is a section along line G—G of FIG. 26.

FIGS. 24 and 25 show an LCD module 52 representative of a fifth embodiment of the present invention. In FIGS. 24 and 25, structural elements identical with the structural elements shown in FIGS. 8–12 are designated by like reference numerals and will not be described specifically in order to avoid redundancy. As shown, the module 52 is essentially similar to the module 26 or 42 except that electrodes 54 and 56 are respectively formed on substantially the entire extensions 48 and 50 as well. With this configuration, the module 52 provides the extensions 12, 14, 48 and 50 with greater mechanical strength than the module 42.

Figure 29:
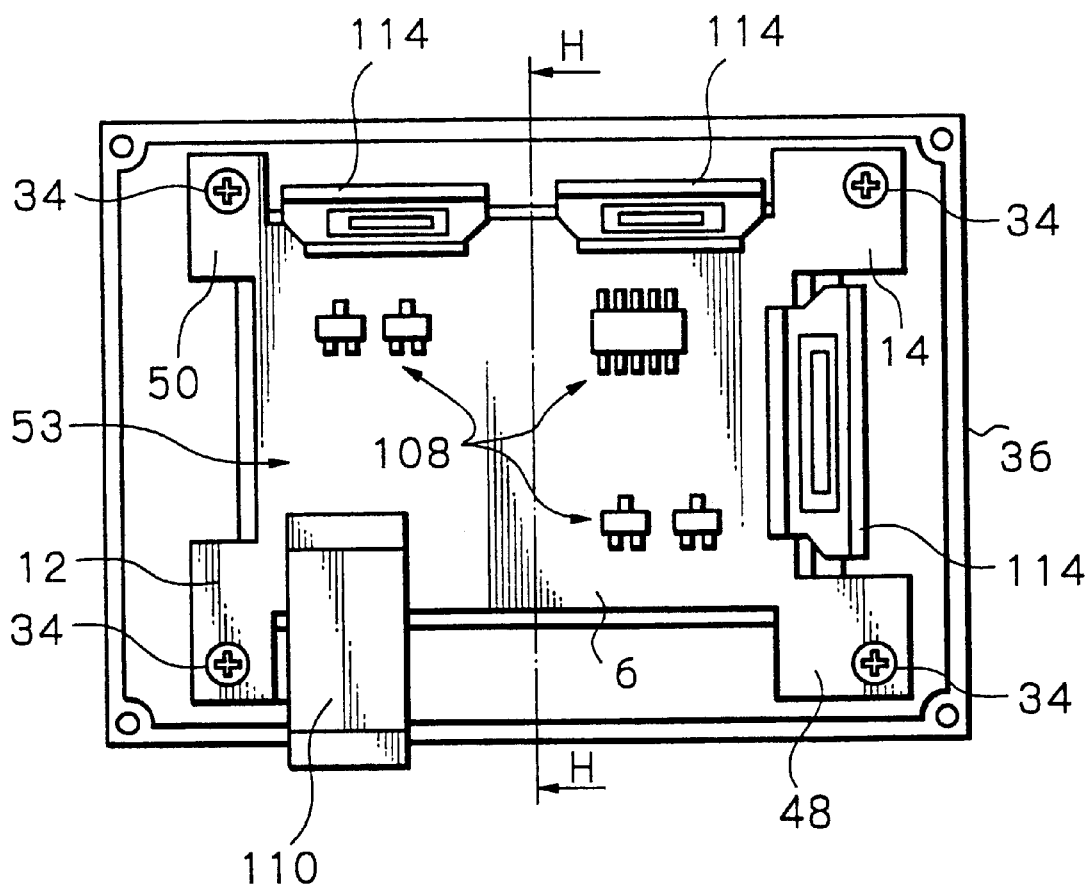
FIG. 29 is a plan view showing the module of the sixth embodiment received in a casing.
Figure 30:
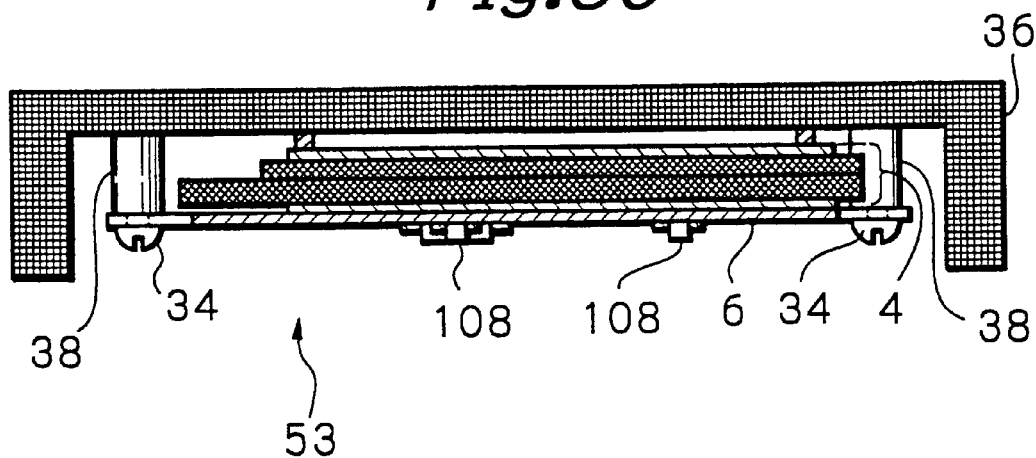
FIG. 30 is a section along line H—H of FIG. 29.

FIGS. 26–30 show an LCD module 53 representative of a sixth embodiment of the present invention. FIG. 29 shows the module 53 received in the casing 36. In FIGS. 26–30, structural elements identical with the structural elements shown in FIGS. 14–18 are designated by like reference numerals and will not be described specifically in order to avoid redundancy. As shown, the module 53 differs from the module 32 in that it has the extensions 12, 14, 48 and 50 at all of the four corners of the panel 4. The extensions 12, 14, 48 and 50 each is formed with the hole 34. Therefore, the module 53, like the module 32, can be directly mounted to the casing 36 without the intermediary of a frame. In addition, the module 53 is fastened to the casing 36 at all of the four corners and therefore more firmly than the module 32.

In summary, in accordance with the present invention, an LCD module forms, when received in a frame by way of example, gaps corresponding to the dimension of extensions between the walls of the inside of the frame and the edges of glass sheets constituting an LCD panel. The gaps prevent the walls of the frame from contacting the edges of the glass sheets and thereby protect the glass sheets from damage even when a shock or an impact acts on the frame. Further, because the corners of the glass sheets do not contact the corners of the inside of the frame, it is not necessary to provide the corners of the inside of the frame with the conventional special configuration. The frame is therefore easy to design and fabricate.

Various modifications will become possible for those skilled in the art after receiving the teachings of the present disclosure without departing from the scope thereof.

What is claimed is:

1. An LCD (Liquid Crystal Display) module comprising:

an LCD panel having a substantially rectangular configuration, as seen in plan view; and a printed circuit board held in close contact with a rear of said LCD panel and carrying thereon circuitry for driving said LCD panel;

said printed circuit board including extensions, extending laterally outward of an entirely coplanar with said LCD panel, at at least two corners of said LCD panel, wherein an electrode is formed on substantially an entire area of each of said extensions of said printed circuit board.

2. An LCD module as claimed in claim 1, further comprising flexible printed circuit boards mounted on edges of said LCD module and each being bent inward over edges of said LCD panel and edges of said printed circuit board, said flexible printed circuit boards each being connected at one end to said printed circuit board and at the other end to said LCD panel.

3. An LCD module as claimed in claim 2, wherein electronic parts are mounted on said flexible printed circuit boards.

4. An LCD module as claimed in claim 1, wherein said printed circuit board further includes an extension extending outward of said LCD panel at at least one corner other than said at least two corners.

5. An LCD module as claimed in claim 1, wherein said LCD module is received in a frame having a substantially rectangular configuration, as seen in a plan view.

* * * * *